United States Patent [19]
Joshi et al.

[11] Patent Number: 5,420,069
[45] Date of Patent: May 30, 1995

[54] METHOD OF MAKING CORROSION RESISTANT, LOW RESISTIVITY COPPER FOR INTERCONNECT METAL LINES

[75] Inventors: Rajiv V. Joshi; Manu J. Tejwani, both of Yorktown Heights; Kris V. Srikrishnan, Wappingers Falls, all of N.Y.

[73] Assignee: International Business Machines Corporation, Armonk, N.Y.

[21] Appl. No.: 999,245

[22] Filed: Dec. 31, 1992

[51] Int. Cl.$^6$ .................................... H01L 21/44
[52] U.S. Cl. .................................... 437/187; 437/245; 437/246
[58] Field of Search .................. 437/187, 245, 246; 148/33.3, DIG. 58

[56] References Cited

U.S. PATENT DOCUMENTS

| | | | |
|---|---|---|---|
| 4,201,601 | 5/1980 | D'Silva | 148/32 |
| 4,448,853 | 5/1984 | Fischer et al. | 428/607 |
| 4,931,410 | 6/1990 | Tokunaga et al. | 437/189 |
| 4,985,750 | 1/1991 | Hoshino | 357/71 |
| 5,060,050 | 10/1991 | Tsuneoka et al. | 357/71 |

OTHER PUBLICATIONS

Isao, et al., "Effect of Substrate Texture on Thin Film Characteristics, 9, Vacuum heat treated Ge-Cu double layer films" Chem. Abstr. vol. 92, No. 20, 173008m (1992).

Berndt, et al. "Superconductivity and annealing behavior of quenched germanuim-noble metal alloy films" Chem. Abstr., vol. 75, No. 2, 12006t (1971).

*Primary Examiner*—Olik Chaudhuri
*Assistant Examiner*—C. Everhart
*Attorney, Agent, or Firm*—Harold Huberfeld

[57] ABSTRACT

The fabrication and use of corrosion resistant Cu/Cu(x)Ge(y) alloy or Cu/Cu$_3$Ge phase bilayer interconnect metal lines is disclosed. A solid state, selective process of forming a Cu$_3$Ge phase or Cu(x)Ge(y) alloy by reacting GeH$_4$ gas with Cu surface at low pressure in CVD reactor at temperatures of 200°–450° C. is described. Corrosion resistant semiconductor devices and packaging interconnects where corrosion of copper interconnects was a problem, is now made possible by the Cu/Cu$_3$Ge phase or Cu$_x$Ge$_y$ alloy bilayer of the present invention. A structure where copper vias are completely or partially converted to Cu$_3$Ge or Cu$_x$Ge$_y$ is presented. Also, dissimilar metals like Al—Cu can be connected by Cu$_3$Ge phase or Cu$_x$Ge$_y$ alloy filled vias to improve electromigration performance.

2 Claims, 2 Drawing Sheets

METHOD OF MAKING CORROSION RESISTANT, LOW RESISTIVITY COPPER FOR INTERCONNECT METAL LINES

The present invention generally relates to semiconductor devices and substrates using copper or copper alloy as a wiring or metallization material. More particularly, the present invention relates to providing corrosion resistant interconnect metal lines.

Presently, copper is used in conventional semiconductor devices for metallization purposes due to its better electro-migration resistance and lower resistivity than aluminum. Copper is also used as thin film wiring for substrates in packaging technology. However, it has been found that copper metallization or wiring suffers from the problems of oxidation and corrosion. Since the protective property of oxidation by an oxide film such as CuO and $Cu_2O$ formed on the surface of Cu. is lower than that of Al, Cu is more susceptible to high temperature oxidation and is more easily corroded in an oxidizing aqueous solution environment usually encountered in semiconductor micro-electronic fabrication processes.

It is, therefore, a critical technical problem to improve the corrosion resistance of the metallization film layer material for a semiconductor device while satisfying the need for high electrical conductivity, heat resistance and electro-migration resistance.

SUMMARY OF THE INVENTION

This invention is directed to providing a corrosion resistant conductor material of low electro-resistivity, comprising a copper surface overlaid with a copper-germanium alloy layer.

The invention is also directed to providing low resistivity, corrosion resistant Cu lines, useful among other things, in interconnect, backend metallization and packaging applications in microelectronics industry.

It is an object of the present invention to provide an electrical conductor having increased corrosion resistance compared to Cu alone.

It is a further object of the present invention to provide a manufacturable process of forming such an improved electrical conductor.

Other objects and advantages will become evident from the following detailed description of the invention.

BRIEF DESCRIPTION OF THE DRAWINGS

The foregoing and other objects, features and many of the attendant advantages of the invention will be better understood upon a reading of the following detailed description when considered in connection with the accompanying drawings, wherein.

DETAILED DESCRIPTION OF THE INVENTION

Figure 1:
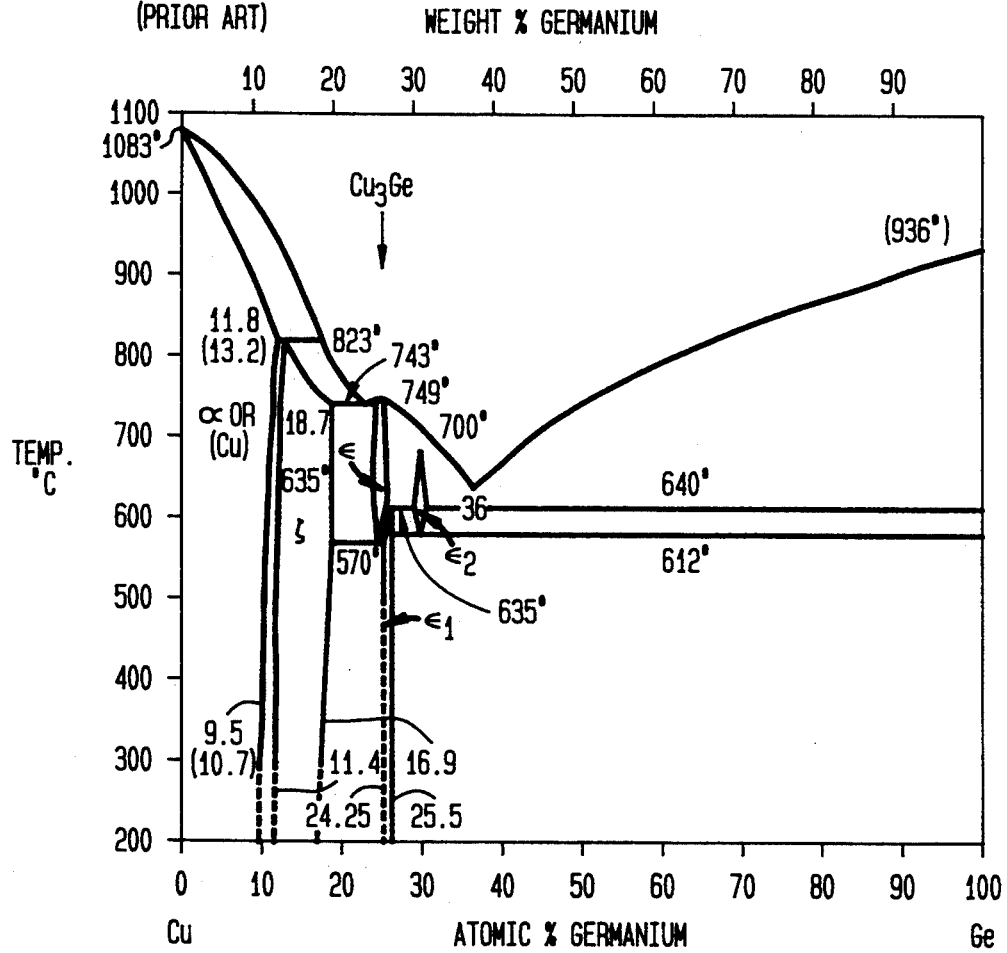
FIG. 1 shows a copper-germanium phase diagram.

The above and various other objects and advantages of the present invention are achieved by a corrosion resistant thin film interconnect material, comprising a bilayer formed of a copper (Cu) film over which a layer of $Cu_3Ge$ or a copper-germanium (Ge) alloy layer has been deposited. Referring to FIG. 1, a known Cu—Ge phase diagram, copper has an appreciable solubility for germanium (9.5 atomic percent). Further, Cu—Ge forms a series of phases up to 25 atomic percent germanium. At 25 atomic percent, a stoichiometric compound $Cu_3Ge$ is formed. These will be referred to as Cu rich phases. Germanium has very low solubility for Cu, indicating that the Ge rich phase will be highly resistive. Between 25 atomic percent Ge and less than 100 percent germanium, the resultant structure will have a mixture of $Cu_3Ge$ and Ge. The copper rich phases have substantially low resistivity in the range of a few micro ohm-cm, whereas the Ge phases will have resistivity in the range of a few ohm-cm. A key object of the invention is to preserve the conductivity of the resultant layer, as shown in TABLE I, which is achieved by limiting the Ge amount and forming preferably Cu rich phases.

Figure 2A:
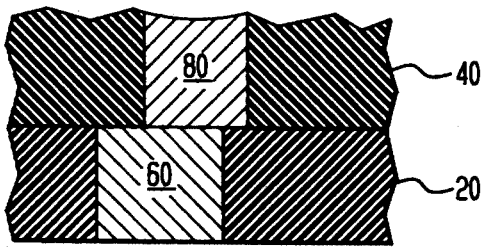
FIGS. 2A and 2B show diagrams of the process of the present invention and the resulting structure of the improved conductor of the present invention.
Figure 2B:
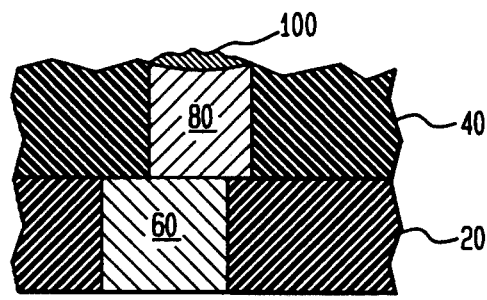

Referring to FIG. 2A, an insulating layer 20, contains a conducting line or feature 60 by contacting the side surfaces thereof. Layer 20 and feature 60 are in physical contact with a semiconductor device or a ceramic substrate (not shown) containing at least one level of wiring and further, making electrical connection to the semiconductor device or to the surface terminals of the substrate. For the purpose of discussing the inventive feature, it is sufficient to examine FIG. 2A. A suitable insulating layer 40 such as $SiO_2$ is deposited over layer 20. A conducting feature 80 is formed in layer 40 by known techniques, including the steps of etching an opening in layer 40 corresponding to feature 80, depositing a seed or an adhesion layer for copper, followed by deposition of copper by one of the following techniques: sputtering, plating, and CVD. The copper deposition process can be selective or blanket. When blanket deposition is used, excess copper is removed by ion milling or chemical-mechanical polishing. The exposed Cu surface is susceptible for corrosion as Copper. A layer of germanium is formed over the copper surface and reacted to form a copper rich alloy phase 100 or $Cu_3Ge$ compound which have excellent passivation properties. As discussed earlier, they also have good electrical conductivity. The resulting structure is shown in FIG. 2B illustrating that feature 80 is in electrical contact with the upper surface of feature 60.

Figure 3A:
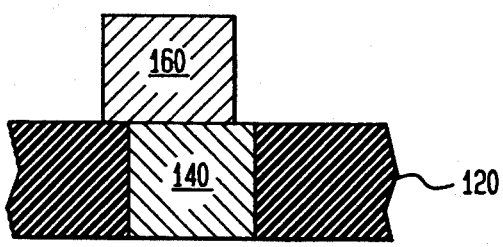
FIGS. 3A and 3B show a diagram of a second embodiment of the process and resulting conductor structure of the present invention.
Figure 3B:
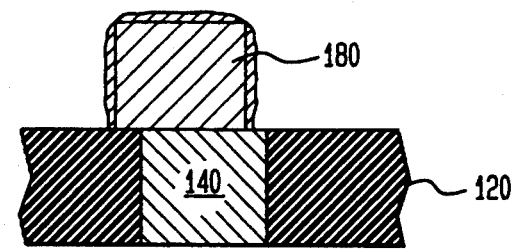

FIGS. 3A and 3B show an example of the present invention when the copper feature 160 is formed freestanding over an insulating layer 120 containing a conductive feature 140. This type of copper feature is achieved by subtractive etching, lift-off and resist plate up followed by resist removal. In this type of structure, the present invention forms the Cu—Ge passivation layer 180 on all exposed surfaces of copper.

A preferred process for forming this alloy layer is by selective deposition of germanium over copper surfaces. The process of forming a thin $Cu(x)Ge(y)$ (where, $x+y=100\%$; $5\%<y<75\%$) layer over Cu lines or surfaces includes exposing the initial Cu layer (or surface) at a low pressure (0.5 Torr to 1 Torr) to a source of germanium, e.g., $GeH_4$ gas, in a chemical vapor deposition (CVD) reactor at temperatures ranging from about 200°–450° C. to convert the outer surface of the Cu lines to Cu(x)Ge(y) or Cu$_3$Ge (FIG. 2). Any Ge containing gas source, e.g. GeH$_4$, Ge$_2$H$_6$ and the like can be used. It is noted that the reaction is a solid state reaction, e.g., of GeH$_4$ gas on Cu which-is quite selective to Cu and does not result in deposition of germanium on oxide/nitride dielectric. It is noted that by increasing the partial pressure of GeH$_4$ more than 0.1 Torr, the Cu(x)Ge(y) alloy can be changed to Cu$_3$Ge or additional Ge can be formed. Furthermore, the process is a batch process with high throughput. The deposition time and the deposition rate must be optimized to minimize total thickness, while at the same time achieve minimum spreading of Ge into Cu. Of course, the alloy can be encapsulated by an organic or inorganic layer.

Although not bound by any theory or mechanism, it is believed that the reaction proceeds as follows:

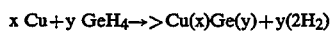

$$x\ Cu + y\ GeH_4 \rightarrow Cu(x)Ge(y) + y(2H_2)$$

The resulting Cu(x)Ge(y) alloy or Cu$_3$Ge forms a capped or overlaid structure as a cover on the copper surface.

The process is particularly advantageous in the manner of (1) passivating all exposed Cu surfaces and vias with the inert an Cu(x)Ge(y) alloy or Cu$_3$Ge; and/or (2) filling all recessed seams in Cu interconnects.

Figure 4A:
FIGS. 4A-C show diagrams of a variation of the use of the present invention in building a vertical interconnect (stud or via) layer.
Figure 4B:
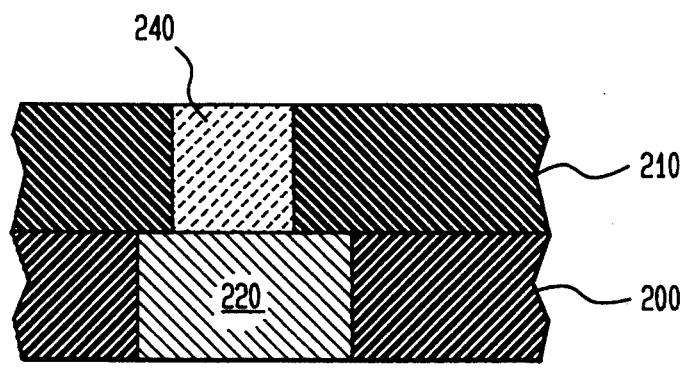
Figure 4C:
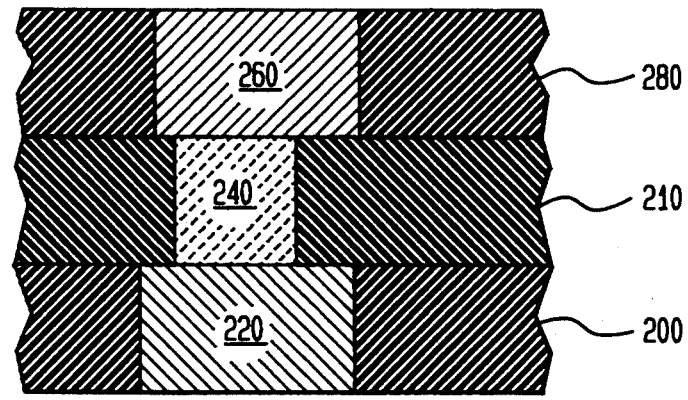

As shown in FIGS. 4A, 4B and 4C, Cu(x)Ge(y) or Cu$_3$Ge studs are used to connect two levels of wiring. Insulating layer 200 containing conductor 220 by contacting the side surfaces thereof and insulating layer 280 containing conductor 260 by contacting the side surfaces thereof represent the two wiring layers that are connected by a stud 240 contained in the insulating layer 210. The stud 240 is in electrical contact with the upper surface of conductor 220 and the lower surface of conductor 260. The present invention envisions the use of Cu(x) Ge(y) or Cu$_3$Ge as the stud material, deposited by the preferred method of the present invention as discussed above.

The wiring levels can be of dissimilar metals, such as Al—Cu, Al—Si, Ti layered Al—Cu or Al—Si, alloyed copper such as Cu—Ti etc. Al—Cu lines with dissimilar studs (e.g., CVD tungsten) have poor electromigration performance. However, if Cu(x)Ge(y) is used as a stud material, the electromigration performance can be improved dramatically, as the Cu—Ge alloy provides a source of Cu which readily replenishes depleted Cu from the conductors and further the Cu—Ge phase does not provide a hard diffusion block as is the case with W. This improvement is achieved while at the same time improving the corrosion resistance of the conductor.

Examples of some semiconductor devices where the improved bilayer of the present invention can be used as conductor elements, are U.S. Pat. Nos. 4,985,750; 4,931,410; 5,060,050 and the like.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the methods and materials described herein are preferred. Unless mentioned otherwise, the techniques employed or contemplated herein are standard methodologies well known to one of ordinary skill in the art. The materials, methods and examples are only illustrative and not limiting.

As is noted above, in the formula Cu(x)Ge(y), x and y are atomic percentages with x+y=100% and 5%<y 75%.

As will be suggested to the skilled artisan, Cu rich phases and in specifically Cu$_3$Ge may also be produced by plating (electrolytic and electroless), sintered powder and sputtered bilayers which are subsequently reacted. However, the solid state methodology described herein is particularly preferred because, as mentioned above, it is truly selective to Cu and does not result in deposition of germanium on an oxide/nitride dielectric. Of course, the Cu(x)Ge(y) or Cu$_3$Ge layer, being inert, provides the desired corrosion resistant property without noticeable effect on the low electrical resistivity of Cu per se, as demonstrated by the data presented in Table 1. Hence, the Cu/Cu(x)Ge(y) bilayer can be advantageously employed wherever corrosion resistance and low electrical resistivity is desired, such as in microelectronics including packaging technology, flex connectors, PCB manufacture, HDI manufacture and the like.

It is understood that the examples and embodiments described herein are for illustrative purposes only and that various modifications or changes in light thereof will be suggested to persons skilled in the art and are to be included within the spirit and purview of this application and scope of the appended claims.

In the following examples a Cu layer having a thickness of 100 nm and a sheet resistance of 0.25 Ω/☐ was exposed to GeH$_4$ in a CVD reactor.

TABLE 1

| Example No. | CVD Temperature (°C.) | CVD Time (min.) | Sheet Resistance (Ω/☐) |
|---|---|---|---|
| 1 | 250 | 5 | 0.251 |
| 2 | 300 | 5 | 0.42 |
| 3 | 350 | 5 | 0.651 |
| 4 | 400 | 5 | 1.659 |
| 5 | 450 | 5 | 2.299 |
| 6 | 300 | 30 | 1.836 |
| 7 | 250 | 73 | 0.899–. |

What is claimed is:

1. A method of producing a corrosion resistant conductor, comprising the step of forming a layer of copper-germanium alloy over a copper surface including reacting said copper surface with a germanium containing gas source at a low partial pressure of 0.5 to 1.0 Torr in a chemical vapor deposition reactor at about 200°–450° C. so that a bilayer of Cu/Cu(x)Ge(y) alloy is formed, wherein x and y are atomic percentages x+y=100% and 5%<y<75%.

2. The method of claim 1, wherein said germanium containing gas source is selected from the group consisting of GeH$_4$ and Ge$_2$H$_6$.

* * * * *